US009257953B2

(12) United States Patent
Christoph

(10) Patent No.: US 9,257,953 B2
(45) Date of Patent: Feb. 9, 2016

(54) DIGITAL EQUALIZING FILTERS WITH FIXED PHASE RESPONSE

(71) Applicant: Harman Becker Automotive Systems GmbH, Karlsbad (DE)

(72) Inventor: Markus Christoph, Straubing (DE)

(73) Assignee: Harman Becker Automotive Systems GmbH, Karlsbad (DE)

(*) Notice: Subject to any disclaimer, the term of this patent is extended or adjusted under 35 U.S.C. 154(b) by 334 days.

(21) Appl. No.: 13/716,154

(22) Filed: Dec. 16, 2012

(65) Prior Publication Data

US 2013/0195287 A1    Aug. 1, 2013

(30) Foreign Application Priority Data

Dec. 16, 2011    (EP) ..................... 11194115

(51) Int. Cl.
| | |
|---|---|
| *H03G 5/00* | (2006.01) |
| *H03H 17/02* | (2006.01) |
| *H04S 7/00* | (2006.01) |
| *H03G 5/16* | (2006.01) |

(52) U.S. Cl.
CPC ................ *H03G 5/00* (2013.01); *H03G 5/005* (2013.01); *H03G 5/165* (2013.01); *H03H 17/0264* (2013.01); *H03H 17/0294* (2013.01); *H04S 7/307* (2013.01); *H03H 2017/0297* (2013.01)

(58) Field of Classification Search
CPC ....... H03G 5/165; H03G 5/005; H03G 9/005; H03G 3/20; H03G 3/00; H03G 9/025; H03G 9/18; H03G 3/005; H03G 3/32; H03G 5/00; H03G 5/025; H03G 7/007; H03G 5/04; H03G 9/02; H04S 7/307; H04S 1/007; H04S 3/02; H04S 3/008; H04S 5/00; H04S 7/30; H04S 7/302; H04S 1/002; G10K 11/1784; H04R 3/04; H04R 3/14; H04R 1/227
USPC ............... 381/98–103, 17, 106, 86, 107, 314, 381/316, 320, 353, 56, 1, 191, 20, 22, 57, 381/59, 61, 63, 71.2, 71.4, 74, 79, 82, 89, 381/94.8, 96, 71.11–71.14
See application file for complete search history.

(56) References Cited

U.S. PATENT DOCUMENTS

| | | | |
|---|---|---|---|
| 5,371,803 A | 12/1994 | Williamson | |
| 5,714,918 A * | 2/1998 | Menkhoff | ................... 333/28 R |
| 2002/0018573 A1 | 2/2002 | Schwartz | |
| 2007/0253577 A1 * | 11/2007 | Yen et al. | ...................... 381/103 |
| 2009/0060019 A1 | 3/2009 | Hsu | |

* cited by examiner

*Primary Examiner* — Akelaw Teshale
(74) *Attorney, Agent, or Firm* — O'Shea Getz P.C.

(57) ABSTRACT

An equalization filter structure for filtering an audio signal within an audio system is disclosed. The equalization filter comprises a first and a second shelving filter each having a fixed first and a fixed second phase response, each of which is determined by a respective cut-off frequency and Q factor which represent the transfer characteristic of the corresponding shelving filter. The first and the second shelving filters are coupled in series and each shelving filter comprises at least one fourth order low-pass filter having a cut-off frequency, a Q factor and a first broadband gain and further at least one fourth order high-pass filter having a second broadband gain and the same cut-off frequency and the same Q factor as the low-pass filter. The fourth order low-pass filter and the fourth order high-pass filter are connected in parallel, such that both filters receive the same input signal and the corresponding filtered signals are summed to form a respective shelving filter output signal. Each fourth order low-pass and high-pass filter is composed of a cascade of two second order low-pass or high-pass filters, respectively, and each second order filter has the same cut-off frequency and Q factor as the corresponding shelving filter.

8 Claims, 8 Drawing Sheets

General Structure of an Equalization
Filter with Fixed Phase Response

General Equalization Filter with Fixed Phase Response

DIGITAL EQUALIZING FILTERS WITH FIXED PHASE RESPONSE

CLAIM OF PRIORITY

This patent application claims priority from EP Application No. 11 194 115.9 filed Dec. 16, 2011 which is hereby incorporated by reference.

FIELD OF TECHNOLOGY

The invention relates to digital equalization filters, which may be used for the purpose of sound tuning or equalization of audio systems so as to achieve a sound impression desired by the listener(s).

RELATED ART

Modern sound systems which are used, for example, in automobiles, typically include a plurality of single loud-speakers configured into highly complex loud-speaker arrays located at different positions of a listening room (e.g., in a passenger compartment of a vehicle). Such sound systems used to be tuned (i.e., optimized) "manually" by acoustic engineers individually for each room or type of room. Usually the tuning is performed subjectively based on the experience and "trained" hearing of the acoustic engineers. The acoustic engineers may therefore use analog or digital filter circuits and tune the filter parameters to achieve a desired, pleasant sound impression Automatic and semi-automatic methods have been developed which are able to perform the task of sound tuning with no or little human interaction. Usually only desired impulse and phase responses (target transfer functions) are defined by the engineers. The target transfer function usually represents the (e.g., binaural) impulse and phase response of an audio signal at a defined listening position within the listening room. Generally digital filters are used for audio signal processing. Usually not only is the magnitude response tuned to match a desired characteristic, but the phase responses are also tuned to influence the resulting sound impression.

Particularly when applying automatic sound tuning methods it may be desirable that phase and magnitude response can be adjusted independently from each other. However, many classes of digital filters distort the magnitude response when designed to provide a well-defined phase response (and vice versa) as phase and magnitude cannot be set independently. One possibility to "shape" a magnitude response without destroying the (already tuned) phase relations between the audio signals provided by the different audio channels is to use linear phase filters (e.g. finite impulse response filters, also referred to as FIR filters).

Linear phase filters have, however, some undesired properties which may give rise to adverse effects known as "pre-ringing" and "temporal diffusion". Thus there is a need for a filter which behaves like a minimum phase filter, but has a fixed phase (non-linear) response that does not change when adjusting the magnitude response of the filter. Such a filter would allow for manipulation of the magnitude response without destroying the (already tuned) phase relations between the different channels of the audio system. At the same time, the un-desired properties of linear phase filters would be avoided.

SUMMARY OF THE INVENTION

An equalization filter structure for filtering an audio signal within an audio system comprises a first and a second shelving filter each having a fixed first and a fixed second phase response, each of which is determined by a respective cut-off frequency and Q factor which represent the transfer characteristic of the corresponding shelving filter. The first and the second shelving filters are coupled in series and each shelving filter comprises at least one fourth order low-pass filter having a cut-off frequency, a Q factor and a first broadband gain and further at least one fourth order high-pass filter having a second broadband gain and the same cut-off frequency and the same Q factor as the low-pass filter. The fourth order low-pass filter and the fourth order high-pass filter are connected in parallel, such that both filters receive the same input signal and the corresponding filtered signals are summed to form a respective shelving filter output signal. Each fourth order low-pass and high-pass filter is composed of a cascade of two second order low-pass or high-pass filters, respectively, and each second order filter has the same cut-off frequency and Q factor as the corresponding shelving filter.

Further, a corresponding method for equalizing audio signals is disclosed.

These and other objects, features and advantages of the present invention will become apparent in light of the detailed description of the embodiments thereof, as illustrated in the accompanying drawings. In the figures, like reference numerals designate corresponding parts.

DESCRIPTION OF THE DRAWINGS

The invention can be better understood with reference to the following drawings and descriptions. The components in the figures are not necessarily to scale, instead emphasis being placed on illustrating the principles of the invention. Moreover, in the figures like reference numerals designate corresponding parts. In the drawings.

DETAILED DESCRIPTION OF THE INVENTION

Figure 1:
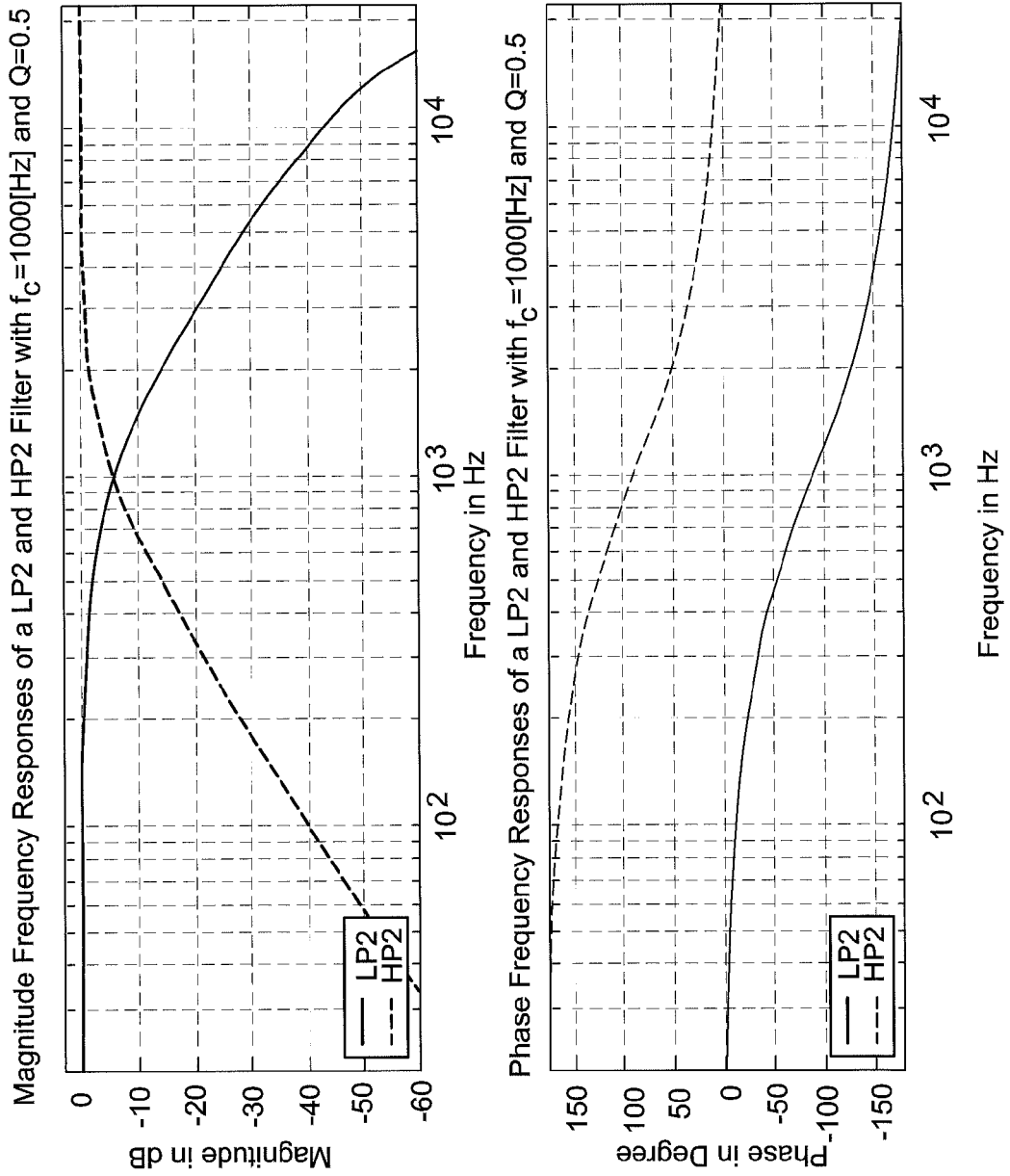
FIG. 1 is a Bode plot of a second order low-pass filter and a second order high-pass filter, each filter having the same cut-off frequency and Q factor.

For the use as equalization filters (digital or analog) filter structures should provide a few parameters via which the filter characteristic can be adjusted. That is, the magnitude response over frequency may be adjusted by tuning only one or a few parameters. One example of commonly used filters are second order low-pass and high-pass filters which may be characterized by the following parameters: cut-off frequency (symbol $f_C$), Q factor (symbol Q), and broadband gain (symbol G). In a digital implementation such filters are often implemented as biquadratic infinite impulse filters (biquad IIR filters). FIG. 1 illustrates the bode plots of a second order low-pass and a second order high-pass filter, each filter having a broadband gain G of zero decibel (G=1 or G=0 dB), a cut-off frequency $f_C$ of one kilohertz ($f_C$=1 kHz) and a Q factor of 0.5. It should be noted that the phase responses of the two filters (low-pass and high-pass) are equal except for the constant phase shift (offset) of 180° between the phase responses.

Figure 2:
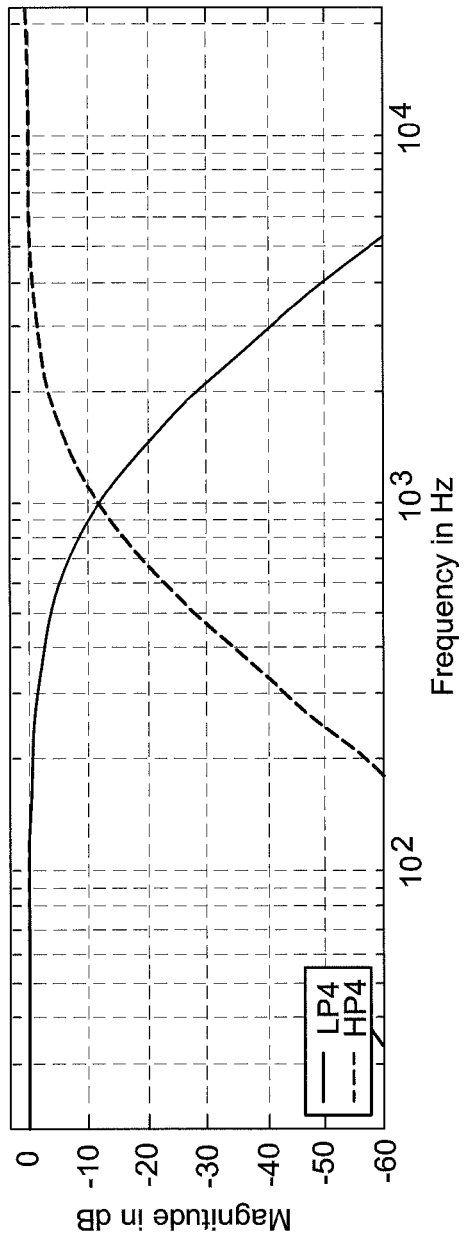
FIG. 2 is a Bode plot of a fourth order low-pass filter and a fourth order high-pass filter, each filter being a cascade of two second order low-pass filters or, respectively, high-pass filters having the same cut-off frequencies and Q factors.
Figure 2:
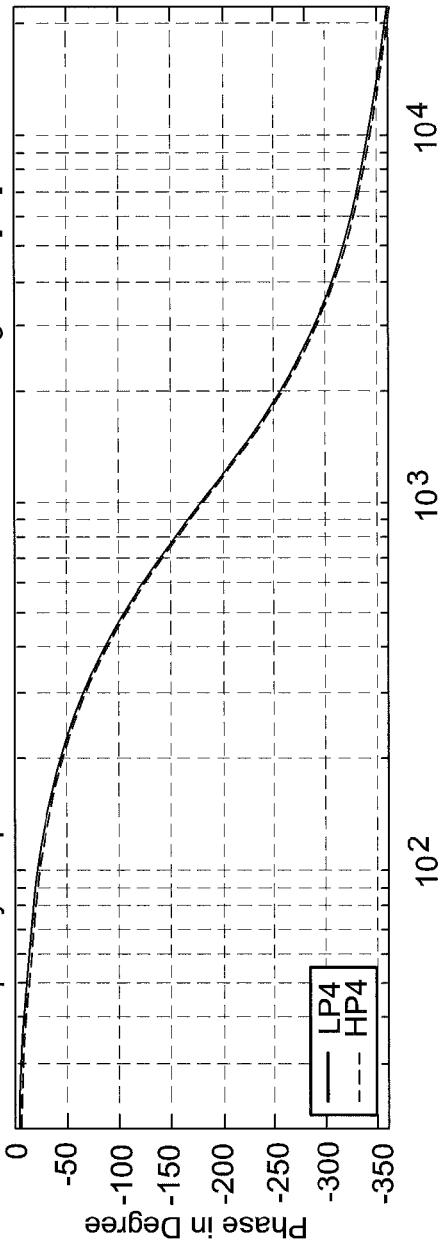

When cascading (i.e., connecting in series) two second order low-pass filters or two second order high-pass filters, each having the same cut-off frequency and Q factor, the resulting fourth order filters have exactly the same phase response, irrespective of whether it is a low-pass filter or a high-pass filter. The corresponding Bode plots of the resulting fourth order (low-pass and high-pass) filters is illustrated in FIG. 2. It should be noted that the filter characteristic of the fourth order low-pass and high-pass filters is only characterized by two filter parameters, namely the cut-off frequency $f_C$ and the Q factor. Further, a broadband gain G may be included. However, varying the broadband gain would only shift the magnitude response along a vertical axis (i.e., add a constant offset in dB) without having any other effect on the magnitude response as such.

Figure 3:
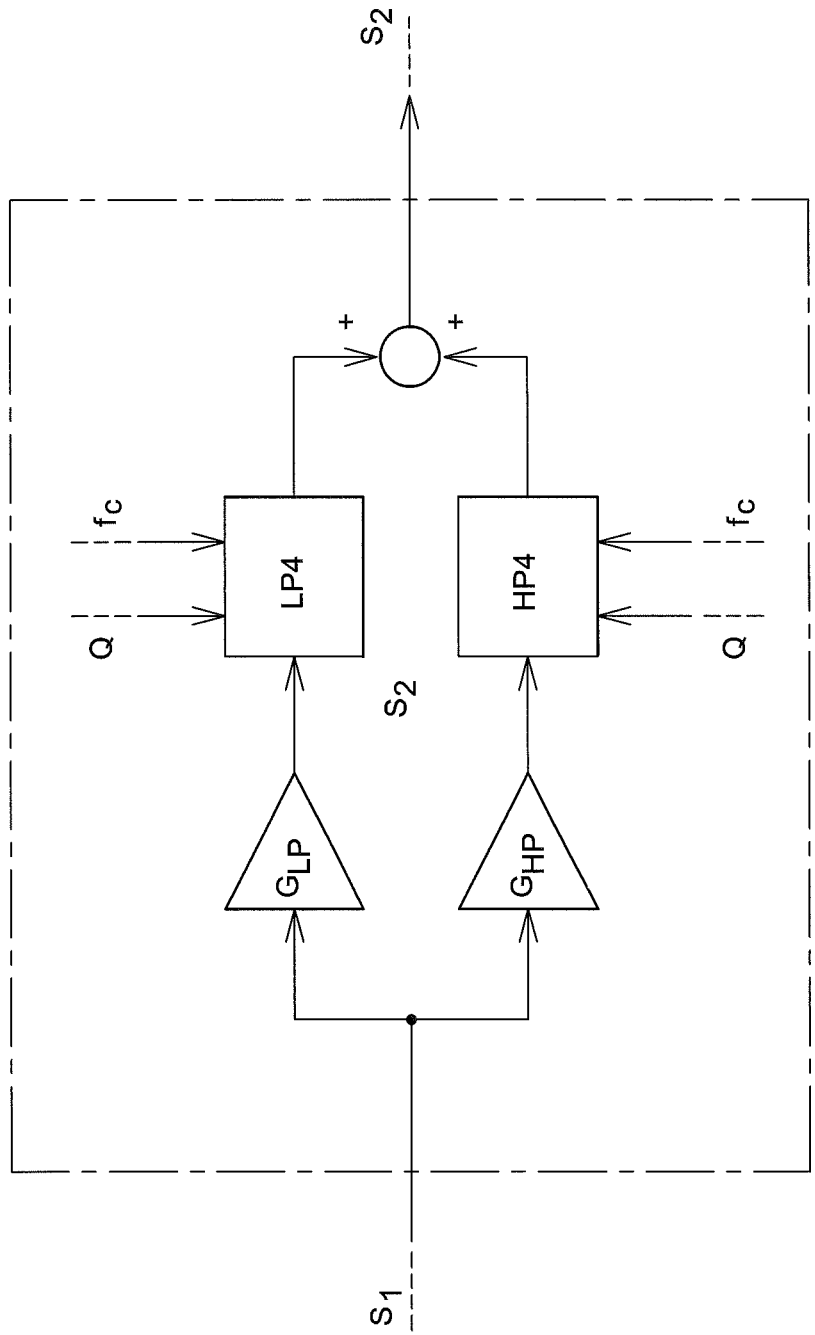
FIG. 3 is a block diagram illustrating a filter structure having a fixed phase response, the filter structure includes a parallel circuit of a fourth order low-pass and a fourth order high-pass filter as illustrated in FIG. 2, each filter may have an individual broadband gain.
Figure 4:
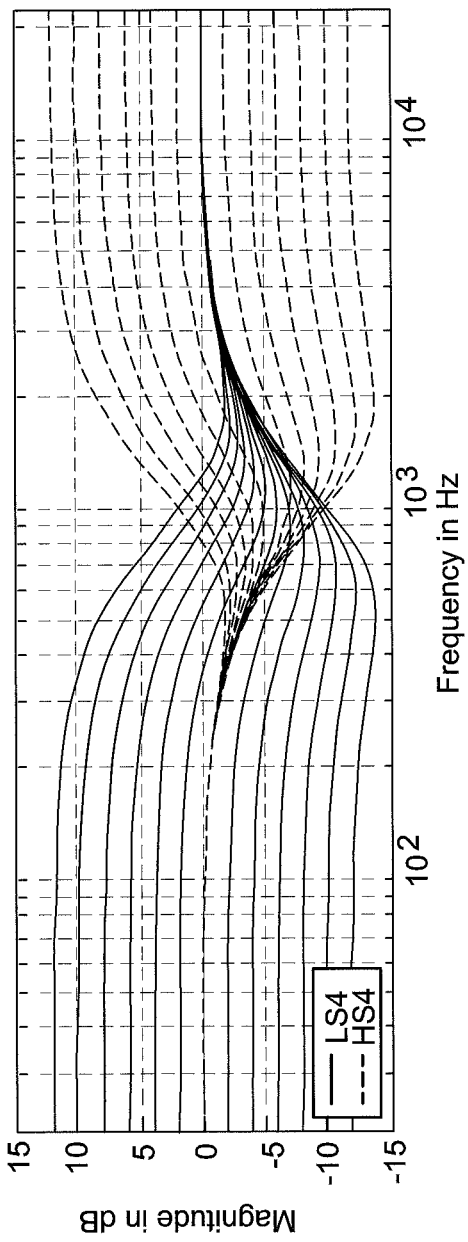
FIG. 4 is a Bode plot illustrating the magnitude and frequency responses of the filter structure of FIG. 3 for different broadband gains, the phase response being fixed and independent of the broadband gains.
Figure 4:
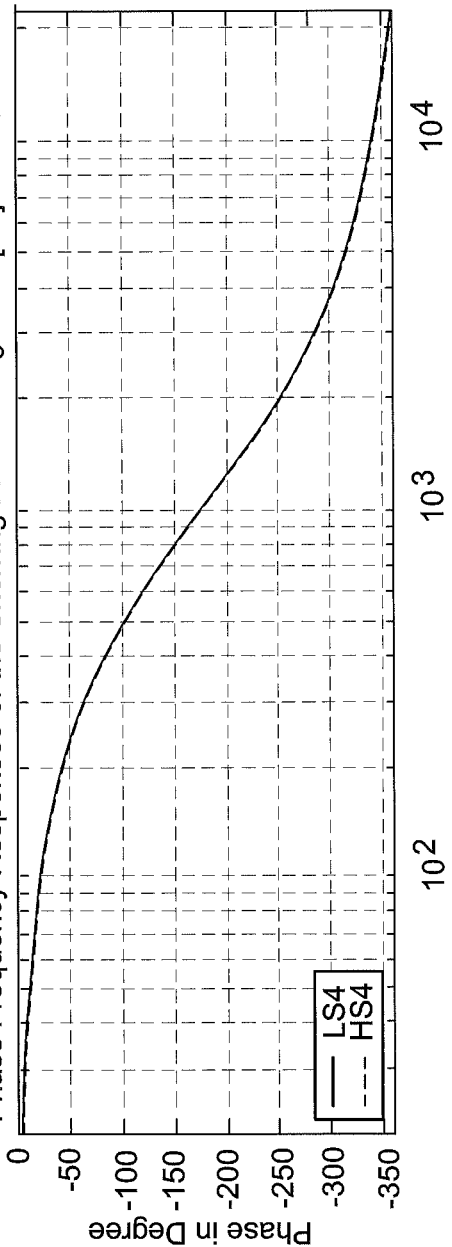

FIG. 3 illustrates a parallel circuit of a fourth order low-pass (denoted as LP4) and a fourth order high-pass (denoted as HP4). Each of the two parallel signal paths (signal branches) includes an individual broadband gain denoted as $G_{LP}$ and $G_{HP}$ respectively. The fourth order filters LP4, HP4 are composed of a cascade of two second order low-pass or, respectively, high-pass filters, and have a magnitude and phase characteristic as illustrated in the Bode plot of FIG. 2. It should be noted that each of the two filters LP4, HP4 use the same Q factor and the same cut-off frequency. The resulting filter structure illustrated in FIG. 3 can be regarded as shelving filter. The input signal supplied to the filter is denoted as $S_1$, the filtered output signal is denoted as $S_2$. The magnitude and phase characteristics of the shelving filter of FIG. 3 is illustrated in FIG. 4 for $f_C$=1 kHz and Q=0.5 and various values of the broadband gains $G_{LP}$ and $G_{HP}$. It should be noted that the phase response is fixed and remains unchanged regardless of whether the filter is configured as "low shelf filter" (for bass control) or "high shelf filter" (for treble control). It should be further noted that the fourth order filters LP4, HP4 may be replaced by cascades of such fourth order filters, thus effectively realizing filters of the order 4·n (4 times n), whereby n is an integer number greater than one. The phase response of the shelving filter is identical to the phase response of an all-pass filter of the same order using the same design parameters (cut-off frequency, Q factor).

Figure 5:
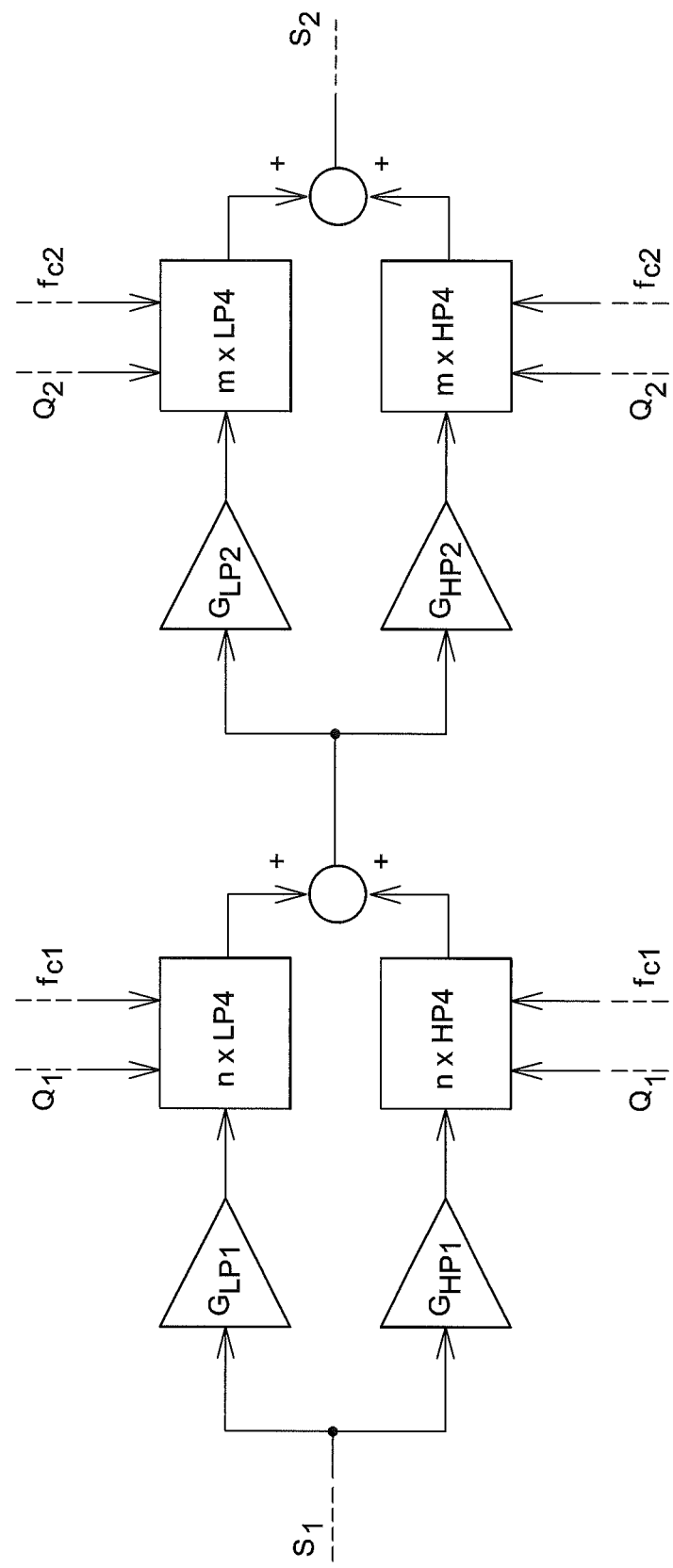
FIG. 5 is a block diagram illustrating a filter structure including two shelving filters as illustrated in FIG. 3 connected in series, each shelving filter may have a different cut-off frequency and Q factor.

FIG. 5 illustrates one example of a generic equalization filter with a fixed phase response. The equalization filter is composed of a series circuit of two shelving filters as illustrated in FIGS. 3 and 4, wherein each shelving filter may include low-pass and high-pass filters of the order of 4·n and 4·n with n and m equals integer numbers greater than or equal to one. The first shelving filter is characterized by the parameters $f_{C1}$ (cut-off frequency) and $Q_1$ (Q factor) and the second shelving filter connected to the first shelving filter downstream thereon is characterized by the parameters $f_{C2}$ (cut-off frequency) and $Q_2$ (Q factor). The broadband gain factors associated with each high-pass and low-pass filter are denoted as $G_{HP1}$, $G_{LP1}$, $G_{HP2}$, and $G_{LP2}$. The subscripts indicate whether the gain is associated with a low-pass (LP) filter or a high-pass (HP) filter and whether the gain is in the first or the second shelving filter. As the shelving filters have a fixed phase response (provided with a fixed cut-off frequency and a fixed Q factor), the generic equalization filter of FIG. 5 also has a fixed phase response which does not change when modifying the magnitude response by adjusting the broadband gain factors $G_{HP1}$, $G_{LP1}$, $G_{HP2}$, and $G_{LP2}$.

Figure 6:
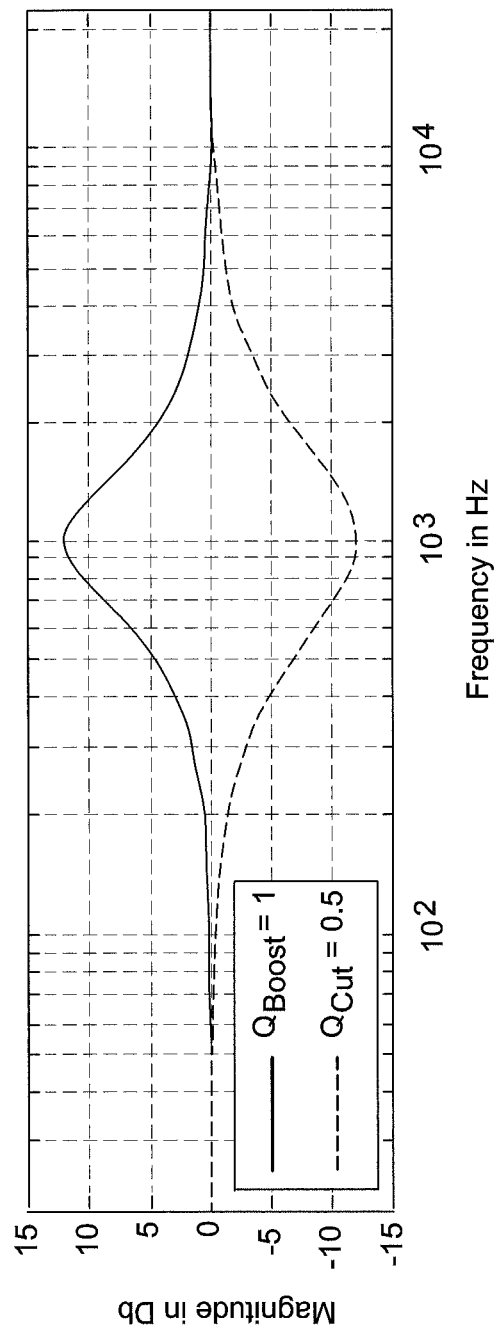
FIG. 6 is a Bode plot for the filter structure of FIG. 5 for two different Q factor values wherein all other parameters (broad band gains, cut-off frequencies) are fixed.
Figure 6:
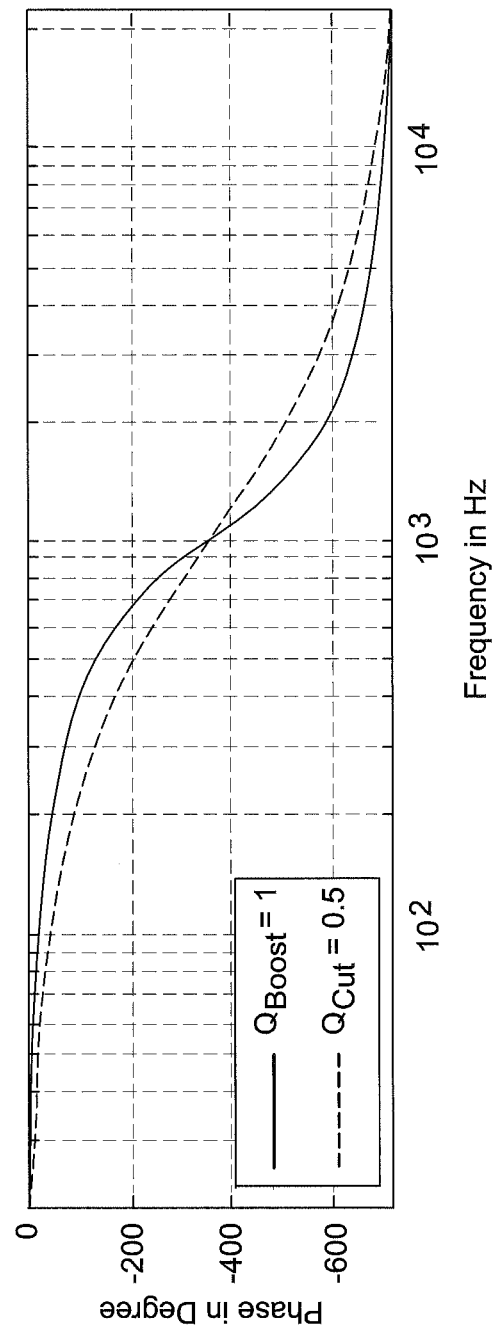

FIG. 6 illustrates the magnitude and frequency responses of the equalization filter of FIG. 5 for two exemplary configurations ($Q_1=Q_2=Q_{Boost}=1$ and $Q_1=Q_2=Q_{Cut}=0.5$) wherein the remaining parameters are constant (m=n=1, $G=G_{LP1}=1/G_{HP1}=1=0$ dB, $G=G_{HP2}=1/G_{LP2}=1=0$ dB, $f_{C1}=f_{C2}=1$ kHz). The phase response is dependent on the Q factor which is kept fixed while tuning the equalization filters by adjusting the gain G. It should be noted that it is the value of the Q factor which determines whether the filter provides amplification ($Q=Q_{Boost}=2$) or attenuation ($Q=Q_{cut}=0.5$), whereas the "border case" is an all-pass when the Q factor equals the square root of ½.

Figure 7:
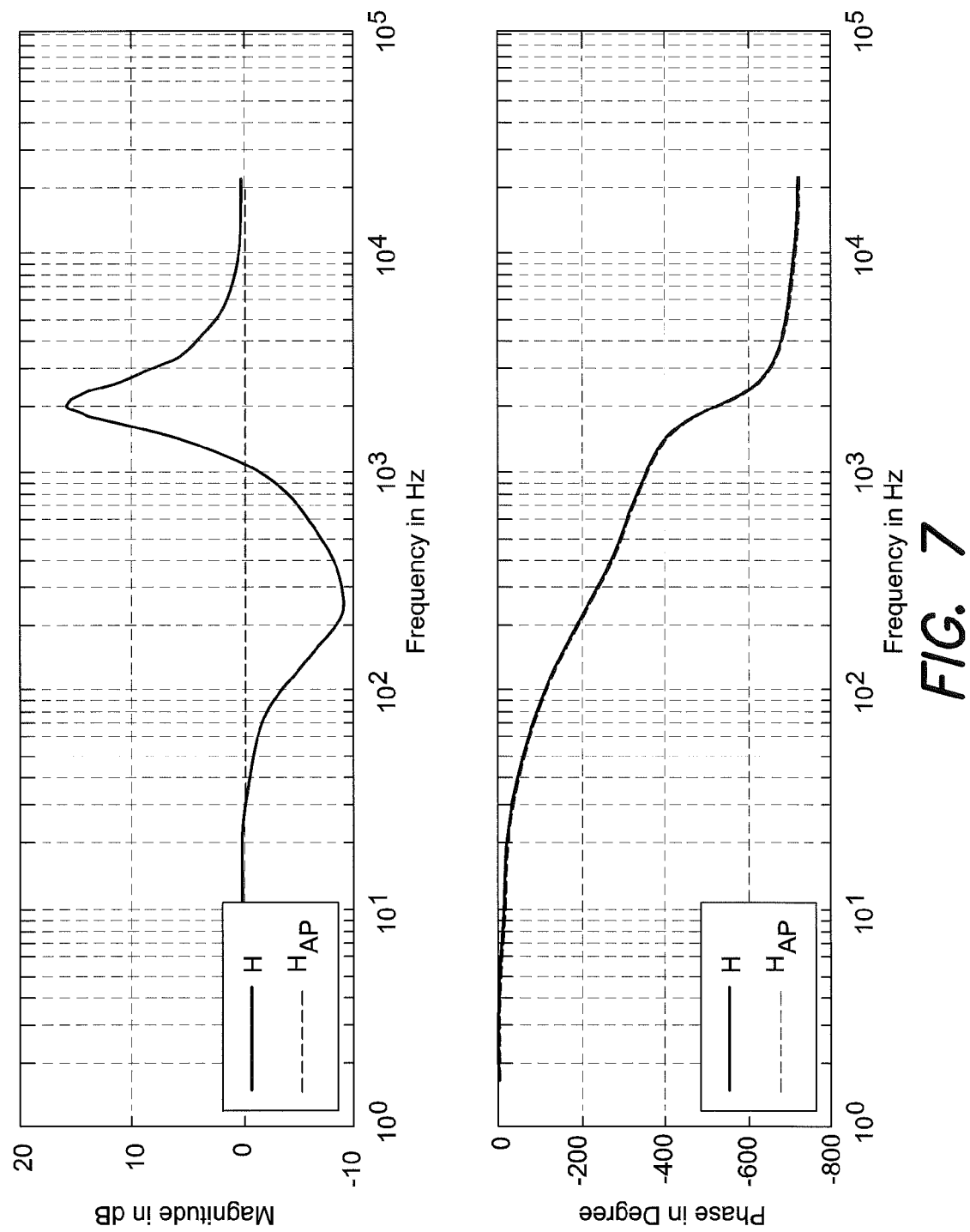
FIG. 7 is a Bode plot for the filter structure of FIG. 5 wherein different parameters (cut-off frequencies and Q factors) are used for each shelving filter.

FIG. 7 illustrates a Bode plot for a more general case of the equalization filter of FIG. 5 (referred to as filter H in FIG. 7). In this example the following settings apply:
 $G_{LP1}=G_{HP2}=3$ dB (adjustable),
 $G_{HP1}=G_{LP2}=-3$ dB (adjustable),
 $f_{C1}=200$ Hz,
 $f_{C2}=2000$ Hz,
 m=n=1,
 $Q_1=0.5$, and
 $Q_2=2$.

Analogous to the previously shown examples the phase response remains fixed while the magnitude response is tuned by adjusting the broadband gains values $G_{HP1}$, $G_{LP1}$, $G_{HP2}$, and $G_{LP2}$. It is always possible to create an all-pass (referred to as $H_{AP}$ in FIG. 7) with exactly the same phase response as the equalization filter H by choosing the appropriate parameters.

Figure 8:
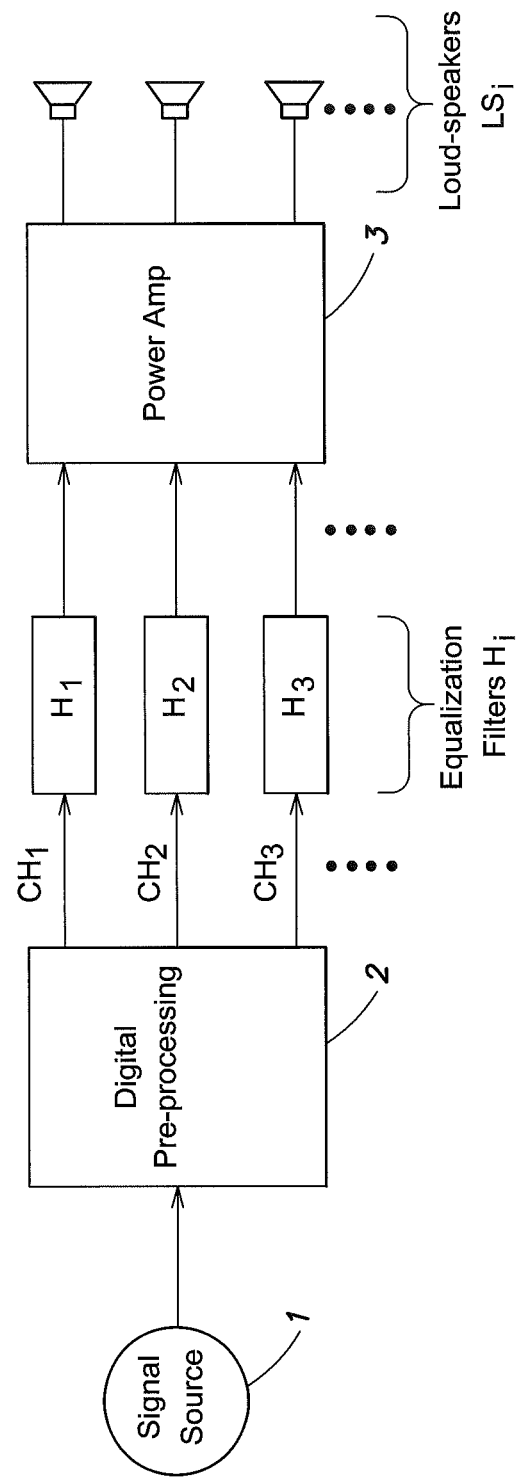
FIG. 8 illustrates the application of equalization filters in an audio system.

FIG. 8 illustrates one exemplary application of equalizing filters as described herein. A signal source 1 which provides an audio signal may be, for example, an FM or a DAB tuner, an MP3 player, a compact disc player or the like. The audio signal may be a mono signal, a stereo signal or a multichannel surround sound signal which is provided as a digital signal or digitized using appropriate analog-to-digital converters. In the example of FIG. 8 the audio signal is supplied to a digital audio signal processor which may perform some digital signal pre-processing operations such as, for example, converting a stereo signal provided from the signal source into a surround sound signal (e.g., 14 audio channels for Dolby Digital Plus coding). The pre-processed audio signals (referred to as CH1, CH2, CH3, etc) of the different audio channels may be supplied to separate equalizing filters $H_1$, $H_2$, $H_3$ which have a filter structure, as illustrated in FIG. 5, that is a cascade of two or more shelving filters as illustrated in FIG. 3. The equalized audio signals are provided to a power amplifier 3 and the corresponding output signals are supplied to the loudspeakers $LS_1$, $LS_2$, $LS_3$, etc. It should be noted that FIG. 8 is a schematic view and components such as digital-to-analog filters, sampling rate converters, etc. which are not necessary to describe the application of the equalizing filters described herein have been omitted for the sake of clarity.

Some important aspects of the invention are summarized in the following paragraphs. However, the elements discussed below are not considered to be a complete list.

An equalization filter structure for filtering an audio signal within an audio system is described in general. The equalization filter comprises a first and a second shelving filter, whereby each shelving filter has a fixed phase response, each of which is determined by a respective cut-off frequency and Q factor which represent the transfer characteristic of the corresponding shelving filter. The first and the second shelving filters are coupled in series and each shelving filter comprises at least one fourth order low-pass filter and at least a fourth order high-pass filter. The fourth-order low-pass filter has a cut-off frequency, a Q factor, and a first broadband gain. The fourth order high-pass filter has a second broadband gain and the same cut-off frequency and the same Q factor as the fourth order low-pass filter. Both the fourth order low-pass filter and the fourth order high-pass filter are connected in parallel, such that both filters receive the same input signal and the corresponding filtered signals are summed to form a respective shelving filter output signal. Each fourth order low-pass and high-pass filter is composed of a cascade of two second order low-pass or high-pass filters, respectively. Thus each second order filter has the same cut-off frequency and Q factor as the corresponding shelving filter.

The fourth order (high-pass and low-pass) filters may be substituted by a cascade of two or more fourth order (high-pass and low-pass) filters all having the same structure.

The cut-off frequencies and the Q factors of the filters composing one individual shelving filter are pre-defined and fixed whereas the broadband gains are variable to adjust the magnitude response of the shelving filter in a desired manner. This may be done separately for each shelving filter. The first and the second shelving filter may be implemented as bass and treble shelving filter, respectively.

In one specific embodiment the cut-off frequencies and the Q factors of all shelving filters are fixed and predefined, whereas the broadband gains are individually adjustable for each shelving filter. Particularly the broadband gain of a fourth order low-pass may be the reciprocal value of the broadband gain of the corresponding fourth order high-pass of the same shelving filter. A bode diagram corresponding to this example, which is a special configuration of the filter structure of FIG. 5, is shown in FIG. 6. The circuit illustrated in FIG. 5, wherein the broadband gains follow the equation $G = G_{LP1} = 1/G_{HP2} = G_{HP2} = 1/G_{LP2}$, is of particular relevance as such filters may be usefully employed as peaking filter (boost and cut filters).

The equalization filter structure described herein may generally be applied to each individual channel of a multi-channel audio system. In this case the equalization filter structure applied to each individual audio channel is configured to provide the same fixed phase response.

Particularly the equalization filter structures of all individual audio channels all may have pre-defined and fixed Q-factors and cut-off frequencies and adjustable broadband gains for adjusting the magnitude response of the respective equalization filter structure.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even when not explicitly mentioned. Further, the methods of the invention may be achieved in either all software implementations that use the appropriate processor instructions or in hybrid implementations that utilize a combination of hardware logic and software logic to achieve the same results. Finally, an implementation using analog filter circuits may be possible, too. Such modifications to the inventive concept are intended to be covered by the appended claims.

The applicant hereby discloses in isolation each individual feature described herein and any combination of two or more such features, to the extent that such features or combinations are capable of being carried out based on the present specification as a whole and in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

Although the present invention has been illustrated and described with respect to several preferred embodiments thereof, various changes, omissions and additions to the form and detail thereof, may be made therein, without departing from the spirit and scope of the invention.

What is claimed is:

1. An equalization filter structure for filtering an audio signal within an audio system, the equalization filter comprising:

a first and a second shelving filter having a fixed first and a fixed second phase response, each of which is determined by a respective cut-off frequency and Q factor which represent the transfer characteristic of the corresponding shelving filter;

wherein the first and the second shelving filters are coupled in series and each shelving filter comprises (i) at least one fourth order low-pass filter having a cut-off frequency, the Q factor and a first broadband gain and (ii) at least one fourth order high-pass filter having the same cut-off frequency and the same Q factor as the low-pass and further having a second broadband gain;

wherein the fourth order low-pass filter and the fourth order high-pass filter are connected in parallel, such that both filters receive the same input signal and the corresponding filtered signals are summed to form a respective shelving filter output signal; and wherein each fourth order low-pass and high-pass filter is composed of a cascade of two second order low-pass or high-pass filters, respectively, each second order filter having the same cut-off frequency and the Q factor as the corresponding shelving filter.

2. The equalization filter structure of claim 1, wherein the cut-off frequencies and the Q factors of the filters comprising one shelving filter are, separately for each shelving filter, pre-defined and fixed and the broadband gains are variable to adjust the magnitude response for equalizing the audio signal in a desired manner.

3. The equalization filter structure of claim 1 wherein the first and the second shelving filter are a bass and a treble shelving filter, respectively.

4. The equalization filter structure of claim 3 wherein the cut-off frequencies and the Q factors are fixed and predefined for the shelving filters and the broadband gains are individually adjustable for each of the shelving filters.

5. The equalization filter structure of claim 1, wherein each shelving filter comprises:

a second fourth order low-pass coupled in series to the first fourth order low-pass; and a second fourth order high-pass coupled in series to the first fourth order high-pass.

6. The equalization filter structure of claim 5, wherein the fourth order low-pass filter of the first shelving filter has a broadband gain G, the fourth order high-pass filter of the first shelving filter has a broadband gain G−1, the fourth order low-pass filter of the second shelving filter has a broadband gain G−1, and the fourth order high-pass filter of the second shelving filter has a broadband gain G, thus implementing a peaking filter with a constant phase characteristic, the magnitude response of the peaking filter being adjustable by adjusting the broadband gain G.

7. A method for equalizing an input audio signal associated with one respective audio channel of an audio system, the method comprising:
   filtering the input audio signal using a first and a second shelving filter having a fixed first and a fixed second phase response, each of which is determined by a respective cut-off frequency and Q factor which represent the transfer characteristic of the corresponding shelving filter;
   wherein the first and the second shelving filters are coupled in series and each shelving filter comprises (i) at least one fourth order low-pass filter having a cut-off frequency, the Q factor and a first broadband gain and (ii) at least one fourth order high-pass filter having the same cut-off frequency and the same Q factor as the low-pass and further having a second broadband gain;
   wherein the fourth order low-pass filter and the fourth order high-pass filter are connected in parallel, such that both filters receive the same input signal and the corresponding filtered signals are summed to form a respective shelving filter output signal; and
   wherein each fourth order low-pass and high-pass filter is composed of a cascade of two second order low-pass or high-pass filters, respectively, each second order filter having the same cut-off frequency and the Q factor as the corresponding shelving filter.

8. The method of claim 7, wherein the cut-off frequencies and the Q factors of the filters comprising one shelving filter are, separately for each shelving filter, pre-defined and fixed, and the method further comprises:
   adjusting the broadband gains to adjust the overall magnitude response of the shelving filters for equalizing the audio signal in a desired manner.

* * * * *